United States Patent
Yuan et al.

(10) Patent No.: US 8,623,718 B2
(45) Date of Patent: Jan. 7, 2014

(54) TILT IMPLANTATION FOR FORMING FINFETS

(75) Inventors: Feng Yuan, Yonghe (TW); Tsung-Lin Lee, Hsin-Chu (TW); Shao-Ming Yu, Zhubei (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 13/247,570

(22) Filed: Sep. 28, 2011

(65) Prior Publication Data

US 2013/0078772 A1 Mar. 28, 2013

(51) Int. Cl.
*H01L 21/00* (2006.01)
(52) U.S. Cl.
USPC ..... 438/163; 438/283; 438/525; 257/E21.442

(58) Field of Classification Search
USPC .......................... 438/529, 531; 257/E21.442
See application file for complete search history.

(56) References Cited

U.S. PATENT DOCUMENTS

| | | | |
|---|---|---|---|
| 2009/0124069 A1* | 5/2009 | Clark et al. | 438/525 |
| 2011/0175165 A1 | 7/2011 | Yu et al. | |

* cited by examiner

*Primary Examiner* — Chandra Chaudhari
(74) *Attorney, Agent, or Firm* — Slater & Matsil, L.L.P.

(57) ABSTRACT

In a method for forming FinFETs, a photo resist is formed to cover a first semiconductor fin in a wafer, wherein a second semiconductor fin adjacent to the first semiconductor fin is not covered by the photo resist. An edge of the photo resist between and parallel to the first and the second semiconductor fins is closer to the first semiconductor fin than to the second semiconductor fin. A tilt implantation is performed to form a lightly-doped source/drain region in the second semiconductor fin, wherein the first tilt implantation is tilted from the second semiconductor fin toward the first semiconductor fin.

19 Claims, 5 Drawing Sheets

TILT IMPLANTATION FOR FORMING FINFETS

BACKGROUND

With the scaling of integrated circuits, more devices are put into a chip. This not only requires the shrinkage of the device size, but it also requires an improvement in the manufacturing techniques. One example involves memory chips. Due to the high capacity requirement of the memory chips, reducing layout area of the devices is especially important. Therefore, the devices in the memory chips are arranged close to each other to save space.

In the memory cell design, layout area, cell stability, and standby current are among the most important factors. Therefore, static random access memory (SRAM) cells have become the main stream in deep sub-micron technology. To achieve maximum density, the distance between devices in the SRAM cells, particularly the distance between N-well regions and P-well regions on which the devices of the SRAM cells are formed, needs to be as small as possible. This pushes the layout rules of lightly doped drain (LDD) regions of the MOS devices to their limit.

Increasingly more SRAM cells are formed of fin field-effect (FinFET) transistors, which have increased drive currents, and hence faster switching speed over that of planar transistors. Conventional formation of the LDD regions of the FinFETs in SRAM cells involves implants. The implantation, however, suffers from non-conformal doping, wherein the bottom portions of the fins have smaller LDD implantation depths than the top portions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming fin field-effect transistors (FinFETs) is provided in accordance with various embodiments. The intermediate stages of forming the FinFETs are illustrated. The variations of the embodiments are discussed. Throughout the various views and illustrative embodiments, like reference numbers are used to designate like elements.

Figure 1:
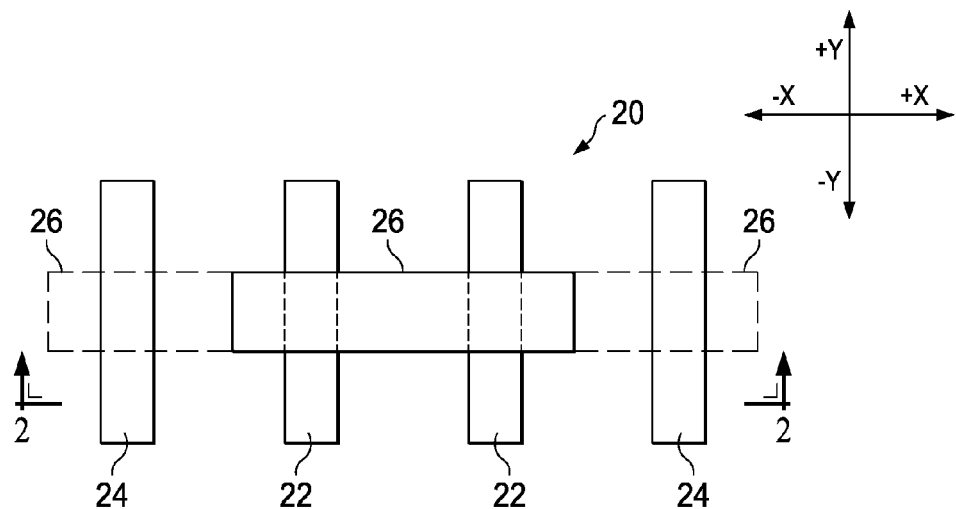
FIGS. 1 through 8 are a top view and cross-sectional views of intermediate stages in the manufacturing of a fin field-effect transistor (FinFET) in accordance with various embodiments.

FIG. 1 illustrates a top view of a portion of wafer 20. Fins 22 and 24 are located at the surface of wafer 20. Fins 22 are used for forming an n-type FinFET, and fins 24 are used for forming p-type FinFETs. The n-type FinFET and the p-type FinFETs may be portions of a static random access memory (SRAM) cell in some embodiments. Fins 22 and 24 have their longitudinal directions parallel to the Y directions. In an embodiment, fins 24 are located on opposite sides of fins 22, although fins 24 may also be located on one side, but not the other side, of fins 22. Gate electrode 26 is formed over middle portions of fins 22. Gate dielectric 28 (not shown in FIG. 1, please refer to FIG. 8) is formed between gate electrode 26 and fins 22. In some embodiments, gate electrode 26 may further extend over one or more of fins 24, and hence the respective p-type FinFETs that comprise fin(s) 24 may share the same gate with the FinFETs of fins 22.

Figure 2:
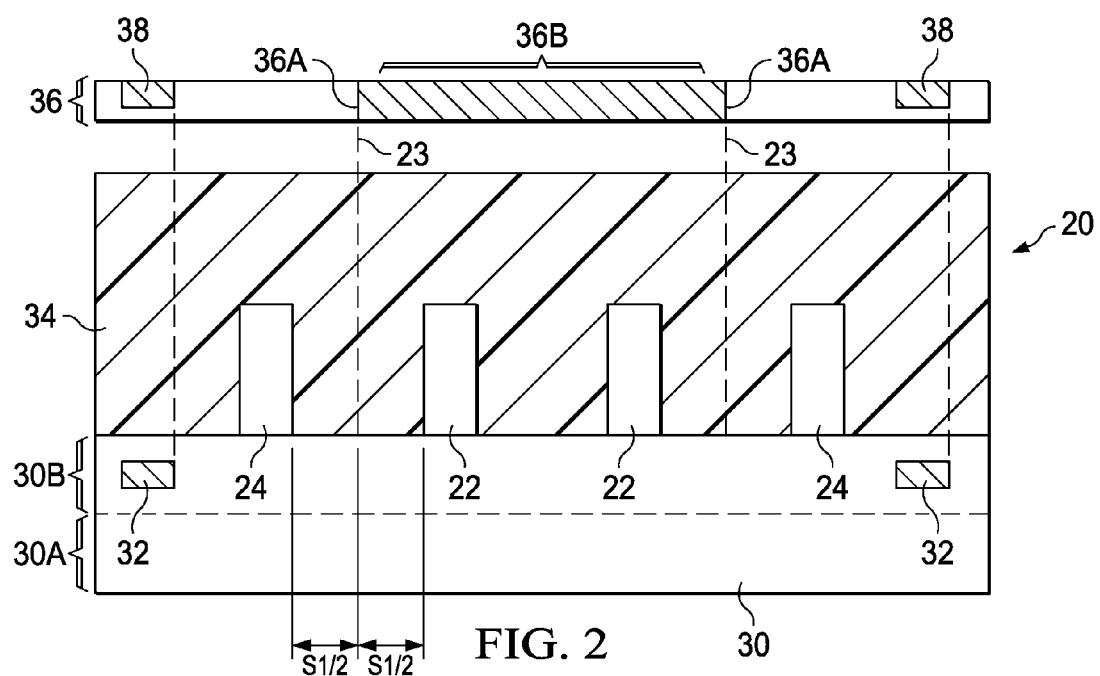

FIGS. 2 through 8 are cross-sectional views of intermediate stages in the formation of an n-type FinFET in accordance with various embodiments, wherein the cross-sectional views are taken from the plane crossing line 2-2 in FIG. 1. Referring to FIG. 2, fins 22 and 24 are formed over substrate 30. In an embodiment, fins 22 and 24 are connected to bulk substrate 30 that is formed of a semiconductor material such as silicon. In alternative embodiments, substrate 30 may include semiconductor layer 30A and insulation layer 30B over semiconductor layer 30A, wherein insulation layer 30B may be formed of a dielectric material such as silicon oxide. Photo resist 34 is formed over wafer 20 and covers fins 22 and 24.

As also shown in FIG. 2, lithography mask 36 is placed over photo resist 34. Lithography mask 36 comprises transparent portions for allowing light (that is used to expose photo resist 34) to pass through, and opaque portions for blocking the light. It is appreciated that although FIG. 2 illustrates that portion 36B (which is over fins 22) of lithography mask 36 is opaque, portion 36B may also be transparent, depending on whether photo resist 34 is a positive photo resist or a negative photo resist. Wafer 20 includes alignment marks 32, and lithography mask 36 includes alignment marks 38. Alignment marks 38 are aligned to the respective ones of alignment marks 32. When alignment marks 38 and 32 are aligned, the interfaces 36A that are between opaque portions and transparent portions of lithography mask 36 may be aligned to, or substantially aligned to, the middle lines 23 between neighboring fins 22 and 24. Accordingly, interfaces 36A may have substantially equal horizontal distances (marked as (S1)/2) to fins 22 and 24.

Figure 3:
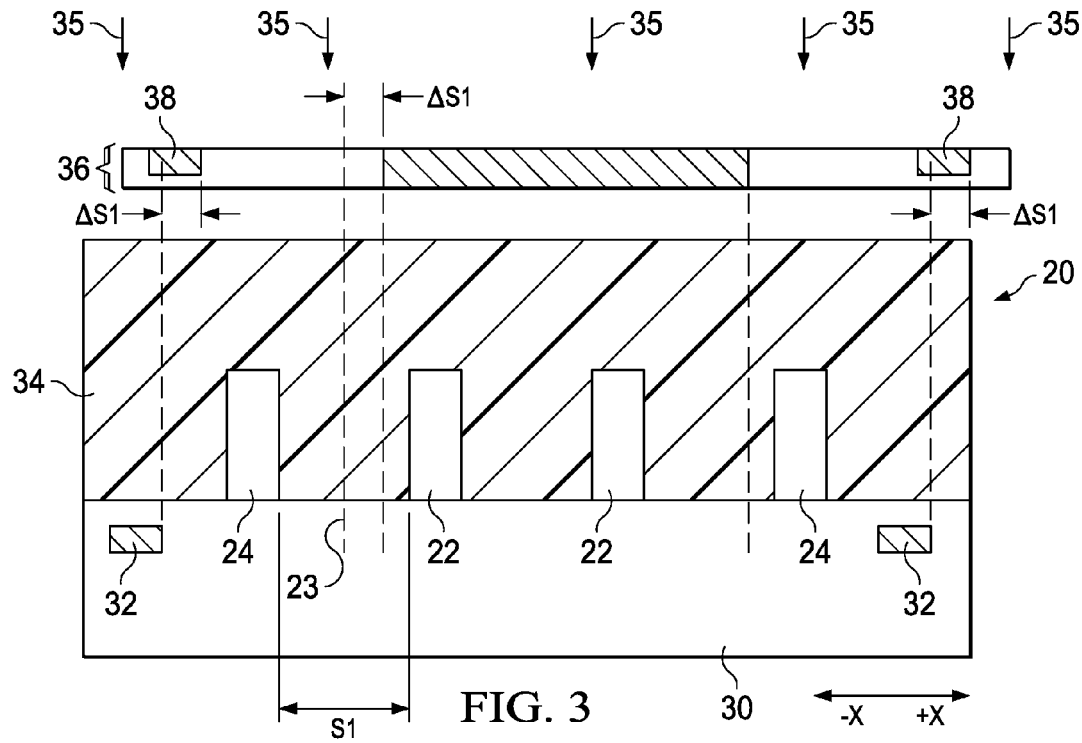

Next, referring to FIG. 3, lithography mask 36 is shifted in the +X direction (also refer to FIG. 1), which is parallel to the major surface of wafer 20 and perpendicular to the longitudinal direction (Y direction in FIG. 1) of fins 22. The shift distance is marked as ΔS1. In an embodiment, assuming the distance between neighboring fins 22 and 24 is S1, the shift distance ΔS1 may be between about 10 percent to about 45 percent distance S1 (the distance between neighboring fins 22 and 24), and may be between about 25 percent and about 50 percent distance S1. Accordingly, after the shift of lithography mask 36, alignment marks 38 and 32 are misaligned, and the misalignment is equal to ΔS1.

Figure 4:
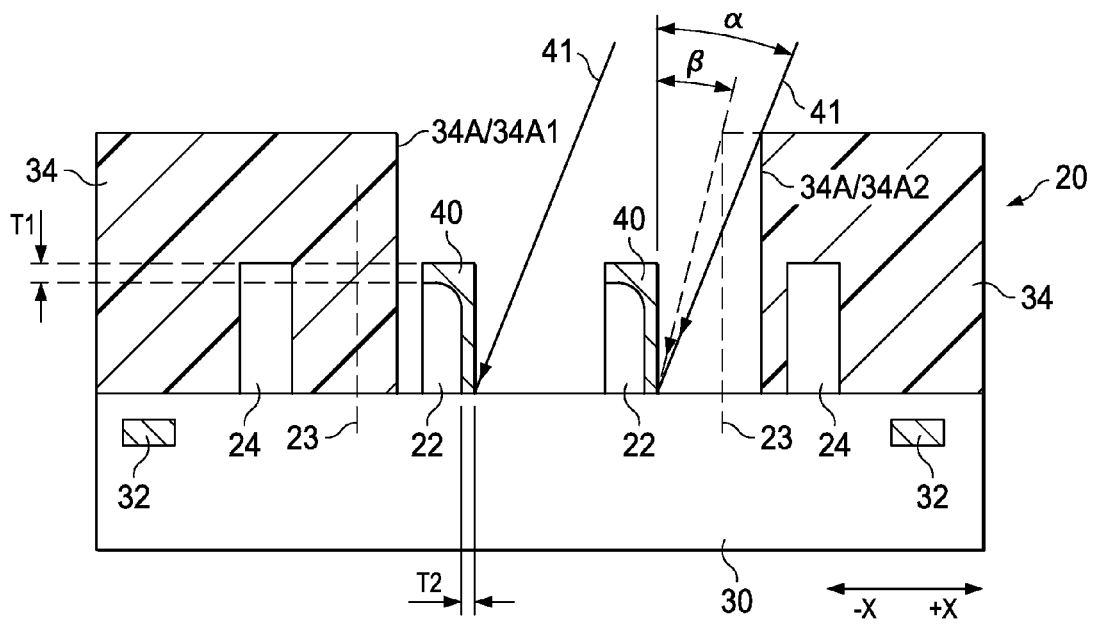

Using the shifted lithography mask 36 as an exposure mask, photo resist 34 is exposed, wherein arrows 35 illustrate the light for the exposure. The exposed photo resist 34 is developed, and some portions of photo resist 34 are removed, while other portions are not removed. The resulting photo resist 34 is shown in FIG. 4, wherein fins 22 are not covered by the remaining portions of photo resist 34, while fins 24 are covered. Edges 34A of photo resist 34 are misaligned from middle line 23 of neighboring fins 22 and 24, and one of edges 34A (marked as 34A1) is closer to a respective adjacent fin 22 than to the adjacent fin 24, while the other one of edges 34A (marked as 34A2) is closer to the adjacent fin 24 than to the adjacent fin 22. Edges 34A may be parallel to the Y direction as in FIG. 1.

A first tilt implantation is then performed to form first portions of LDD regions 40, wherein the first tilt implantation (symbolized by arrows 41) is tilted from the right side of the illustrated fins 22, and is tilted toward the −X direction, which is opposite to the direction (+X direction) that lithography mask 36 is shifted toward (FIG. 3). The implanted impurity may include an n-type impurity such as phosphorous, arsenic, or combinations thereof. The tilt implantation may be performed at tilt angle $\alpha 1$, wherein the maximum tilt angle $\alpha 1$ may be between about 20 degrees and about 60 degrees, for example. It is observed that this maximum value of tilt angle $\alpha 1$ is greater than the maximum tilt angle $\beta$ when edges 34A of photo resist 34 is aligned to middle line 23. The maximum value of tilt angle $\alpha 1$ is such that if the tilt implantation is performed at a tilt angle greater than the maximum tilt angle $\alpha$, at least bottom portions of fins 22 are blocked by photo resist 34 from receiving the implanted dopants. Accordingly, by shifting edges 34A of photo resist 34 away from middle lines 23, the conformity of the resulting LDD regions 40 is improved, and the sidewall portions of LDD regions 40 may have thickness T2 close to thickness T1 of top portions of LDD regions 40. After the tilt implantation, photo resist 34 is removed, for example, by ashing.

Figure 5:
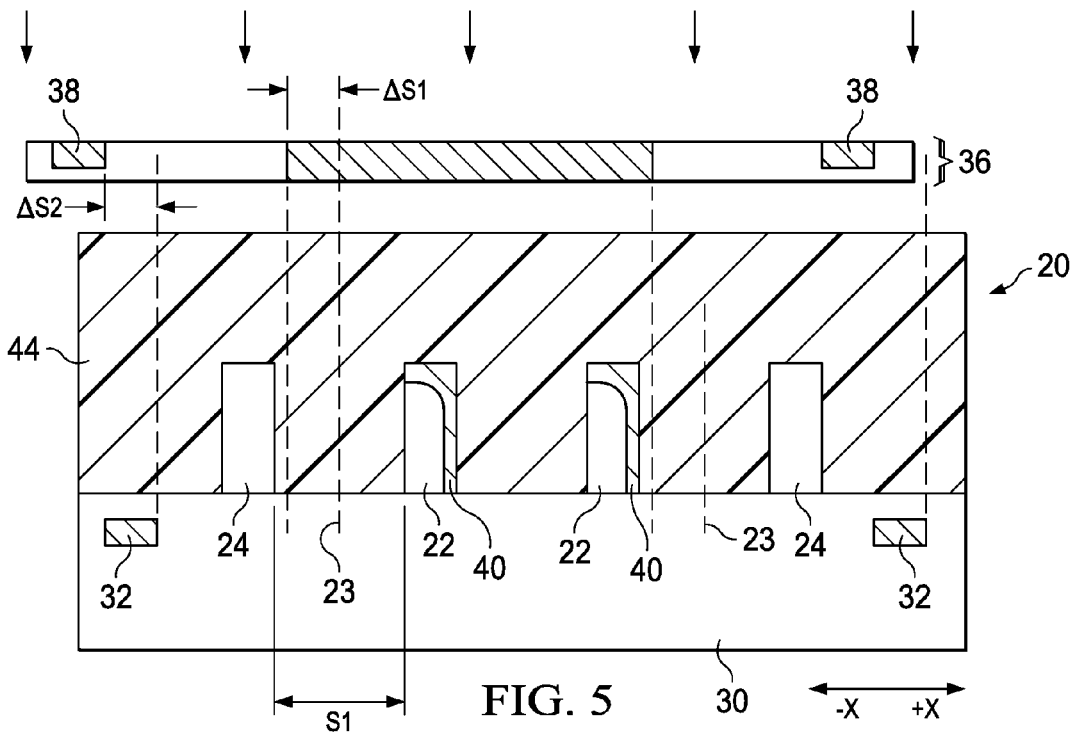
Figure 6:
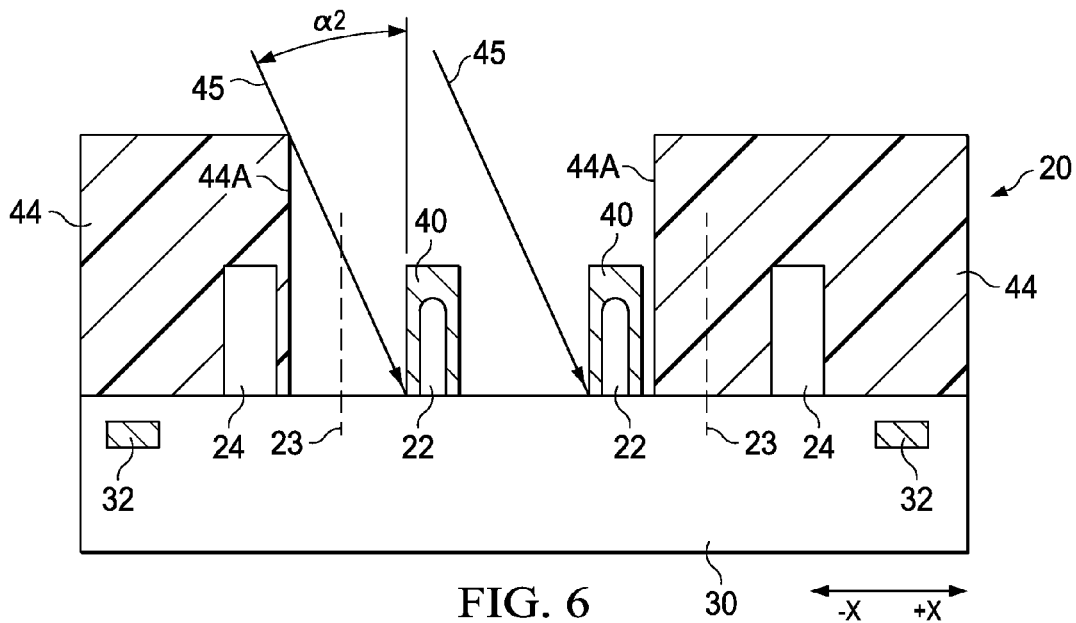

FIGS. 5 and 6 illustrate the formation and the patterning of photo resist 44, and the tilt implantation for forming additional portions of LDD regions 40 using photo resist 44 as an implantation mask. Referring to FIG. 5, photo resist 44 is formed. Mask 36, which may be the same lithography mask 36 used in the step shown in FIG. 3, is used to expose photo resist 44. When exposing photo resist 44, lithography mask 36 is first aligned, so that alignment marks 38 are aligned to alignment marks 32 in wafer 20. Lithography mask 36 is then shifted in −X direction, which is the opposite direction that lithography mask 36 is shifted toward in the step shown in FIG. 3. The distance of the shift, which is illustrated as ΔS2, may be essentially the same as the magnitude ΔS1 of the shift as shown in FIG. 3, although the shift distance ΔS1 may be different from shift distance ΔS2.

Next, using lithography mask 36 as an exposure mask, photo resist 44 is exposed, as indicated by arrows. The exposed photo resist 44 is developed, and the resulting photo resist 44 is shown in FIG. 6. Fins 22 are not covered by photo resist 44, while fins 24 are covered. Edges 44A of the resulting photo resist are misaligned from the respective middle lines 23 of neighboring fins 22 and 24. Similarly, one of edges 44A is closer to fin 24 than to the respective fin 22, while the other one of edges 44A is closer to fin 22 than to the respective fin 24.

A second tilt implantation (represented by arrows 45) is then performed to form additional portions of LDD regions 40, wherein the second tilt implantation is tilt in the +X direction. The implanted impurity may be essentially the same as in the first tilt implant. The tilt may be performed at tilt angle $\alpha 2$, wherein the maximum value of tilt angle $\alpha 2$ may be between about 20 degrees and about 60 degrees, for example, and may be substantially equal to the maximum tilt angle $\alpha 1$ in FIG. 4. Similarly, by shifting the position of the patterned photo resist 44, the conformity of the implantation is improved, and the sidewall portions of LDD regions 40 may have thickness close to the thickness of the top portions of LDD regions 40. After the tilt implantation, photo resist 44 is removed.

Figure 7:
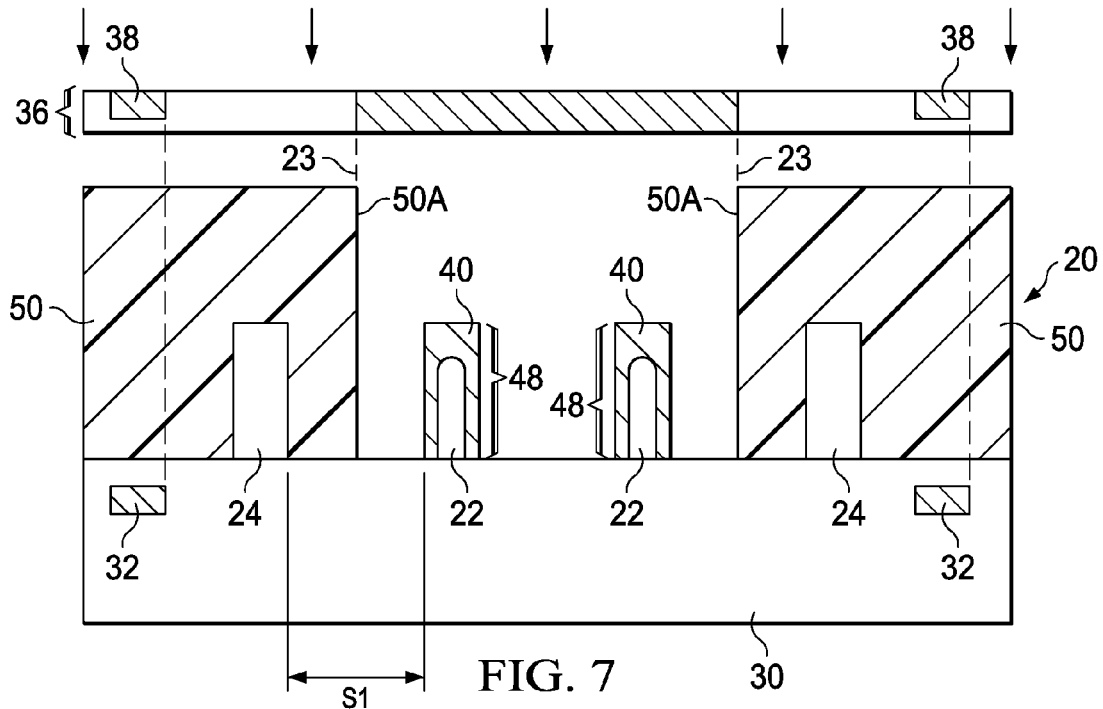
Figure 8:
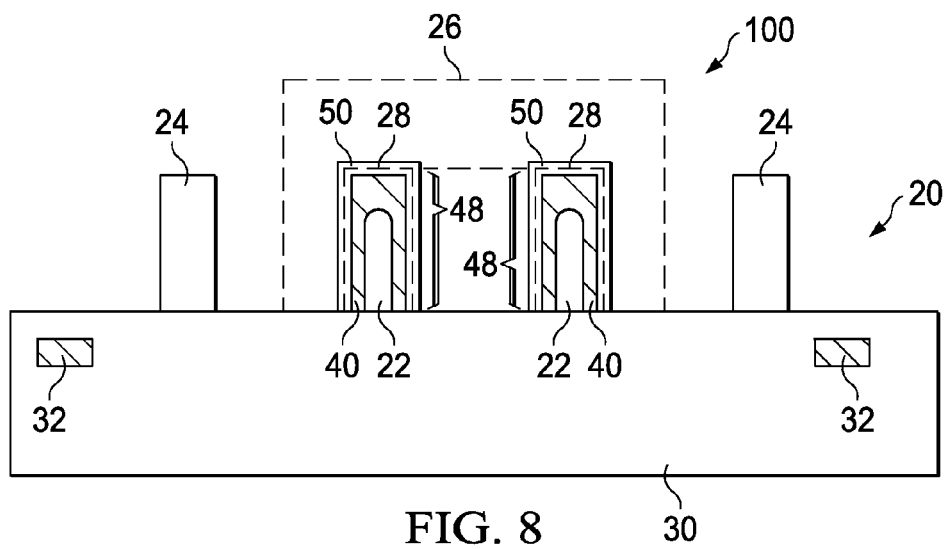

FIG. 7 illustrates the formation of deep source/drain regions 48, which may be formed by implanting an n-type impurity into fins 22. Deep source/drain regions 48 may extend into entireties of fins 22. Next, as shown in FIG. 8, source/drain silicide regions 50 are formed on the top surface and sidewalls of fins 22, and n-Type FinFET 100 is formed. Gate electrode 26 and gate dielectric 28 are also illustrated. Gate electrode 26 and gate dielectric 28 are illustrated using dashed lines since they are not in the illustrated plane. It is noted that at the time source/drain silicide regions 50 are formed, the LDD regions, source/drain regions, and the source/drain silicide regions of p-type FinFETs that are based on fins 24 may also be formed. The details of the p-type FinFETs formed from fins 24 are not shown.

Figure 9:
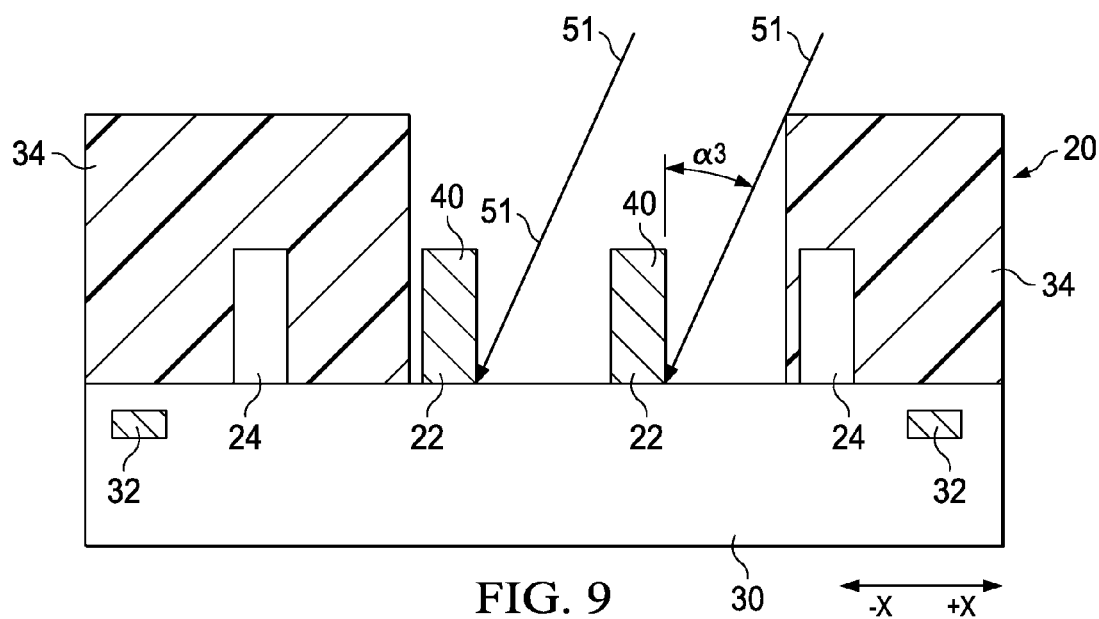
FIG. 9 illustrates a cross-sectional view of an intermediate stage in the manufacturing of a FinFET in accordance with various alternative embodiments.

FIG. 9 illustrates the cross-sectional views of an intermediate stage in the manufacturing of a FinFET in accordance with alternative embodiments. Unless specified otherwise, the materials and formation methods of the components in these embodiments are essentially the same as the like components, which are denoted by like reference numerals in the embodiment shown in FIGS. 1 through 8. The initial steps of these embodiments are essentially the same as shown in FIGS. 1 through 3, wherein photo resist 34 is formed in FIG. 2. Next, as also shown in FIG. 3, photo resist 34 is exposed. For the exposure step, the respective lithography mask 36 is shifted in the +X direction, so that alignment marks 38 (also in FIG. 3) are misaligned to alignment marks 32, wherein the misalignment is represented as ΔS1. Photo resist 34 is then developed, and the portion of photo resist 34 covering fins 22 is removed.

Next, as shown in FIG. 9, a tilt implantation (represented using arrows 51) is formed. The tilt angle $\alpha 3$ may be essentially the same as tilt angle $\alpha 1$ as shown in FIG. 4. The energy may be increased over the energy used in the implantation steps shown in FIGS. 4 and 6, so that the resulting LDD regions 40 may substantially extend to entireties of fins 22. In these embodiments, the tilt implantation is tilted toward the −X direction, while no tilt implantation tilted toward the +X direction is performed for the formation of LDD regions in fins 22. Accordingly, the steps shown in FIGS. 5 and 6 are omitted in these embodiments. Next, as shown in FIGS. 7 and 8, deep source/drain regions 48 and silicide regions 50 are formed.

Although FIGS. 1 through 9 illustrate the methods for forming n-type FinFETs, one skilled in the art will realize that the teaching of the embodiments is readily available for the formation of p-type FinFETs, with the conductivity types of the respective LDD regions and deep source/drain regions as shown in the above-discussed embodiments inverted.

In the embodiments, by shifting the positions of the photo resists used for tilt implanting LDD regions, greater tilt angles may be achieved for the tilt implants, and hence the conformity of the implanted LDD regions in the fins of the FinFETs is improved.

In accordance with embodiments, a photo resist is formed to cover a first semiconductor fin in a wafer, wherein a second semiconductor fin adjacent to the first semiconductor fin is not covered by the photo resist. An edge of the photo resist between the first and the second semiconductor fins is closer to the first semiconductor fin than to the second semiconductor fin. A tilt implantation is performed to form a lightly-doped source/drain region in the second semiconductor fin, wherein the first tilt implantation is tilted from the second semiconductor fin toward the first semiconductor fin.

In accordance with other embodiments, a method includes applying a first photo resist over a first semiconductor fin and a second semiconductor fin in a wafer, wherein the first and the second semiconductor fins have longitudinal directions parallel to each other, and exposing the first photo resist using a lithography mask and developing the first photo resist to cover the first semiconductor fin, wherein the second semiconductor fin is not covered. The first photo resist has a first edge between the first and the second semiconductor fins. A first tilt implantation is performed to form a first portion of a lightly-doped source/drain region in the second semiconductor fin, wherein the first tilt implantation is performed tilting to a first direction. The first photo resist is then removed. A second photo resist is formed over the first and the second semiconductor fins, and is exposed using the lithography mask, and developed. The second photo resist covers the first semiconductor fin, while the second semiconductor fin is not covered. The second photo resist has a second edge between the first and the second semiconductor fins, wherein a plane of the first edge is misaligned to a plane of the second edge. A second tilt implantation is performed to form a second portion of the lightly-doped source/drain region in the second semiconductor fin using the second photo resist as an implantation mask, wherein the second tilt implantation is performed tilting to a second direction opposite to the first direction.

In accordance with yet other embodiments, a method includes applying a photo resist over a first semiconductor fin and a second semiconductor fin in a wafer, wherein the first and the second semiconductor fins have longitudinal directions parallel to each other. The longitudinal directions are parallel to a major surface of the wafer. The photo resist is exposed using a lithography mask, and is developed. The photo resist has an edge between, and parallel to, the first and the second semiconductor fins. A tilt implantation is performed to form a lightly-doped source/drain region in the second semiconductor fin, wherein the first tilt implantation is performed tilting to a first direction perpendicular to the longitudinal directions, and wherein no LDD tilt implantation is performed tilting to a second direction opposite to the first direction.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first photo resist covering a first semiconductor fin in a wafer, wherein a second semiconductor fin adjacent to the first semiconductor fin is not covered by the first photo resist, and wherein an edge of the first photo resist between the first and the second semiconductor fins is closer to the first semiconductor fin than to the second semiconductor fin; and
    performing a first tilt implantation to form a lightly-doped source/drain region in the second semiconductor fin, wherein the first tilt implantation is tilted from the second semiconductor fin toward the first semiconductor fin, wherein the first tilt implantation is performed at a maximum tilt angle allowed by the first photo resist, and wherein at the maximum tilt angle, an impurity introduced by the first tilt implantation reaches a bottom of the second semiconductor fin.

2. The method of claim 1 further comprising:
    removing the first photo resist;
    forming a second photo resist covering the first semiconductor fin, wherein the second semiconductor fin is not covered by the second photo resist, and wherein an edge of the second photo resist between the first and the second semiconductor fins is closer to the second semiconductor fin than to the first semiconductor fin; and
    performing a second tilt implantation to form an additional portion of the lightly-doped source/drain region in the second semiconductor fin, wherein the second tilt implantation is tilted in a direction opposite to a tilt direction of the first tilt implantation.

3. The method of claim 1, wherein no additional tilt implantations tilted in a direction opposite to a tilt direction of the first tilt implantation is performed to form any additional LDD region in the second semiconductor fin.

4. The method of claim 1, wherein the step of forming the first photo resist comprises:
    applying the first photo resist over the first semiconductor fin and the second semiconductor fin;
    placing a lithography mask over the first photo resist;
    aligning alignment masks in the lithography mask to respective alignment masks in the wafer;
    shifting the lithography mask toward the first semiconductor fin for a distance; and
    after the step of shifting, exposing the first photo resist.

5. The method of claim 4, wherein the distance is between about 25 percent and about 50 percent of a distance between the first and the second semiconductor fins.

6. A method comprising:
    applying a first photo resist over a first semiconductor fin and a second semiconductor fin in a wafer, wherein the first and the second semiconductor fins have longitudinal directions parallel to each other;
    exposing the first photo resist using a lithography mask and developing the first photo resist to cover the first semiconductor fin, wherein the second semiconductor fin is not covered, and wherein the first photo resist comprises a first edge between the first and the second semiconductor fins;
    performing a first tilt implantation to form a first portion of a lightly-doped source/drain region in the second semiconductor fin, wherein the first tilt implantation is performed tilting to a first direction;
    removing the first photo resist;
    applying a second photo resist over the first and the second semiconductor fins;
    exposing the second photo resist using the lithography mask and developing the second photo resist to cover the first semiconductor fin, wherein the second semiconductor fin is not covered, and wherein the second photo resist comprises a second edge between the first and the second semiconductor fins, and wherein a plane of the first edge is misaligned to a plane of the second edge; and
    performing a second tilt implantation to form a second portion of the lightly-doped source/drain region in the second semiconductor fin using the second photo resist as an implantation mask, wherein the second tilt implantation is performed tilting to a second direction opposite to the first direction.

7. The method of claim 6 further comprising, before the step of exposing the first photo resist:

aligning alignment masks in the lithography mask to respective alignment masks in the wafer; and shifting the lithography mask toward the second direction by a first distance, wherein the step of exposing the first photo resist is performed with the lithography mask shifted toward the second direction.

8. The method of claim 7 further comprising, before the step of exposing the second photo resist:

aligning the alignment masks in the lithography mask to respective alignment masks in the wafer; and shifting the lithography mask toward the first direction by a second distance, wherein the step of exposing the second photo resist is performed with the lithography mask toward the first direction.

9. The method of claim 8, wherein the first distance is substantially equal to the second distance.

10. The method of claim 7, wherein the first distance is between about 25 percent and about 50 percent of a distance between the first and the second semiconductor fins.

11. The method of claim 6, wherein the first tilt implantation is performed at a maximum tilt angle allowed by the first photo resist, and wherein the second tilt implantation is performed at a maximum tilt angle allowed by the second photo resist.

12. The method of claim 6, wherein the first and the second edges are on opposite sides of a middle line between the first and the second semiconductor fins.

13. The method of claim 6 further comprising performing an implantation to form a deep source/drain region in the second semiconductor fin.

14. A method comprising:

applying a photo resist over a first semiconductor fin and a second semiconductor fin in a wafer, wherein the first and the second semiconductor fins have longitudinal directions parallel to each other, and wherein the longitudinal directions are parallel to a major surface of the wafer;

exposing the photo resist using a lithography mask;

developing the photo resist, wherein the photo resist comprises an edge between, and parallel to, the first and the second semiconductor fins; and performing a tilt implantation to form a lightly-doped source/drain region in the second semiconductor fin, wherein the tilt implantation is performed tilting to a first direction perpendicular to the longitudinal directions, and wherein no LDD tilt implantation is performed tilting to a second direction opposite to the first direction.

15. The method of claim 14 further comprising, before the step of exposing the photo resist:

aligning alignment masks in the lithography mask to respective alignment masks in the wafer; and shifting the lithography mask toward the second direction by a distance.

16. The method of claim 15, wherein the distance is between about 25 percent and about 50 percent of a distance between the first and the second semiconductor fins.

17. The method of claim 14, wherein after the tilt implantation, the lightly-doped source/drain region extends into substantially an entirety of the second semiconductor fin.

18. The method of claim 14, wherein the edge of the photo resist is misaligned with a middle line between the first and the second semiconductor fins.

19. The method of claim 14, wherein the tilt implantation is performed at a maximum tilt angle allowed by the photo resist, and wherein at the maximum tilt angle, an impurity introduced by the tilt implantation reaches a bottom of the second semiconductor fin.

* * * * *